(12) United States Patent
Burke

(10) Patent No.: US 11,886,177 B1
(45) Date of Patent: Jan. 30, 2024

(54) SYSTEM AND METHOD FOR MANUFACTURING SYSTEM DATA ANALYSIS

(71) Applicant: Arch Systems Inc., Palo Alto, CA (US)

(72) Inventor: Timothy Matthew Burke, Palo Alto, CA (US)

(73) Assignee: Arch Systems Inc., Palo Alto, CA (US)

(\*) Notice: Subject to any disclaimer, the term of this patent is extended or adjusted under 35 U.S.C. 154(b) by 0 days.

(21) Appl. No.: 18/239,044

(22) Filed: Aug. 28, 2023

Related U.S. Application Data

(60) Provisional application No. 63/442,826, filed on Feb. 2, 2023, provisional application No. 63/401,474, filed on Aug. 26, 2022.

(51) Int. Cl.
*G05B 23/02* (2006.01)
*G05B 19/418* (2006.01)

(52) U.S. Cl.
CPC ... *G05B 23/0221* (2013.01); *G05B 19/41875* (2013.01); *G05B 23/0224* (2013.01); *G05B 23/0283* (2013.01)

(58) Field of Classification Search
CPC .......... G05B 23/0221; G05B 19/41875; G05B 23/0224; G05B 23/0283
See application file for complete search history.

(56) References Cited

U.S. PATENT DOCUMENTS

| | | | |
|---|---|---|---|
| 5,245,421 A | 9/1993 | Robertson et al. | |
| 5,822,542 A * | 10/1998 | Smith | H04N 5/76 348/E7.086 |
| 6,760,471 B1 | 7/2004 | Raymond | |
| 10,963,346 B2 | 3/2021 | Garvey et al. | |
| 10,997,517 B2 | 5/2021 | Garvey et al. | |
| 2006/0155425 A1 | 7/2006 | Howlett et al. | |
| 2007/0047797 A1 | 3/2007 | Vilella | |
| 2008/0307643 A1* | 12/2008 | Sozansky | H05K 7/20509 29/843 |
| 2009/0040167 A1* | 2/2009 | Sun | G09G 3/3696 345/99 |
| 2009/0262743 A1* | 10/2009 | Uyehara | H04L 43/08 370/394 |
| 2014/0036459 A1 | 2/2014 | Gutierrez et al. | |
| 2017/0215493 A1 | 8/2017 | Maxey et al. | |
| 2018/0175582 A1* | 6/2018 | Rothberg | H01S 3/08072 |
| 2018/0300865 A1 | 10/2018 | Weiss et al. | |
| 2019/0019280 A1 | 1/2019 | Rao et al. | |
| 2020/0126829 A1 | 4/2020 | Matsui et al. | |
| 2020/0387601 A1* | 12/2020 | Schat | G06F 11/349 |
| 2023/0148312 A1* | 5/2023 | Niemczuk | A61B 5/1455 600/316 |

OTHER PUBLICATIONS

Dunning, Ted, et al., "Computing Extremely Accurate Quantiles Using t-Digests", https://arxiv.org/abs/1902.04023, Feb. 11, 2019.

\* cited by examiner

*Primary Examiner* — Mohammad K Islam

(74) *Attorney, Agent, or Firm* — Jeffrey Schox; Samuel Rosenthal

(57) ABSTRACT

A method for manufacturing system data analysis, preferably including receiving a query, determining a set of digests, and/or determining a query result. The method can optionally include merging the set of digests and/or providing the query result. A system for manufacturing system data analysis, preferably including a set of machines, a plurality of digests, and/or a set of computing systems.

22 Claims, 14 Drawing Sheets year_1: exceeds query -> descend
week_1: entirely outside query
week_2: entirely within query -> select week_2 digest as lowest-resolution digest remaining query range: week 3
week_3: entirely within query -> add week_3 digest to set of digests query range satisfied year_1: exceeds query -> descend
week_1: entirely within query -> select week_2 digest as lowest-resolution digest remaining query range: days 8–9
week_2: exceeds query -> descend
day_1: entirely within query -> add day_1 digest to set of digests remaining query range: day 9
day_2: entirely within query -> add day_2 digest to set of digests query range satisfied

SYSTEM AND METHOD FOR MANUFACTURING SYSTEM DATA ANALYSIS

CROSS-REFERENCE TO RELATED APPLICATIONS

This application claims the benefit of U.S. Provisional Application Ser. No. 63/401,474, filed on 26 Aug. 2022, and of U.S. Provisional Application Ser. No. 63/442,826, filed on 2 Feb. 2023, each of which is incorporated in its entirety by this reference.

TECHNICAL FIELD

This invention relates generally to the data analysis field, and more specifically to a new and useful system and method for manufacturing system data analysis in the data analysis field.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview

Figure 1:
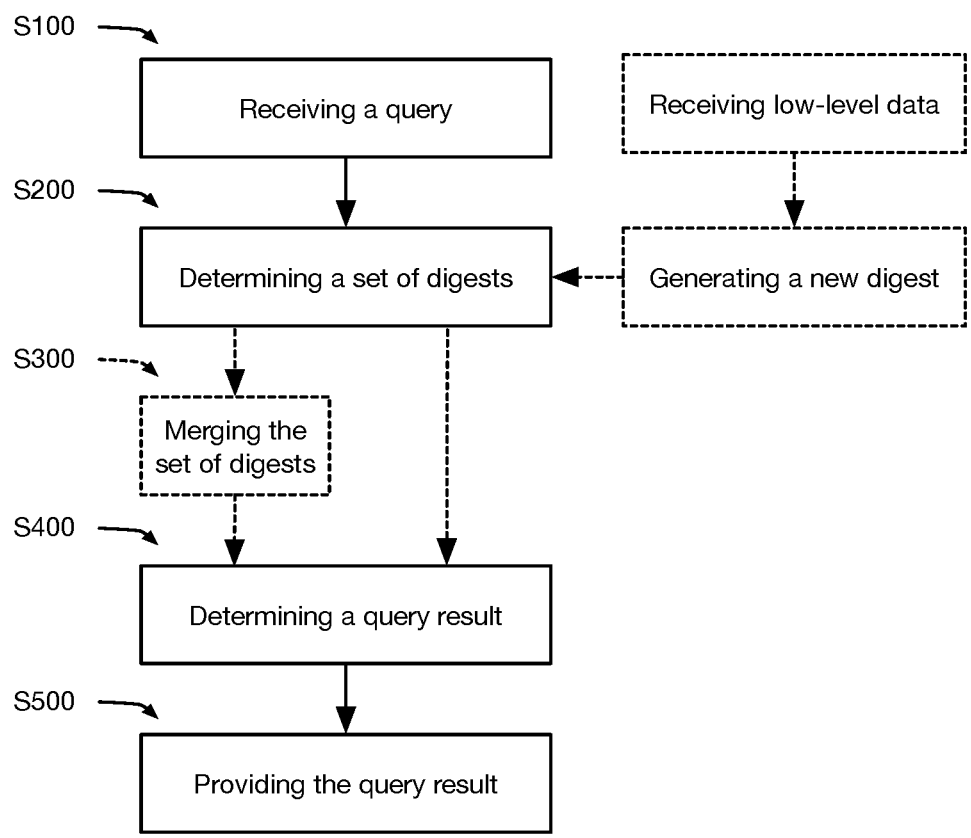
FIG. 1 is a schematic representation of a variant of the method.

As shown in FIG. 1, variants of the method for manufacturing system data analysis can include: receiving a query S100, determining a set of digests S200, optionally merging the set of digests S300, determining a query result S400, and optionally providing the query result S500. The method can additionally or alternatively include acting based on the query result (and/or based on any other suitable information). In some examples, the method can include one or more elements (e.g., the entire 'method 100' described therein, or any suitable elements thereof) such as described in U.S. patent application Ser. No. 18/217,757, filed 3 Jul. 2023 and titled "METHOD FOR MANUFACTURING SYSTEM ANALYSIS AND/OR MAINTENANCE", which is herein incorporated in its entirety by this reference. For example, the method for machine program analysis can include 'receiving factory information S110', 'associating metrics with factory components S120', 'acting based on metric associations S130', and/or 'operating factory machines S105' such as described in U.S. patent application Ser. No. 18/217,757 (e.g., wherein one or more of these elements are performed as part of and/or in cooperation with determining the query result S400, providing the query result S500, and/or acting based on the query result, such as wherein determining the query result S400 may include 'receiving factory information S110' and/or 'associating metrics with factory components S120', and/or wherein acting based on the query result may include 'acting based on metric associations S130'). However, the method can additionally and/or alternatively include any other suitable elements.

In an illustrative example, the method can include: receiving a query (e.g., from a user, such as through an API) that includes a time range and a set of dimension values; determining a set of digests (e.g., t-digest, q-digest, etc.) by determining digests (from a plurality of digests) associated with at least one dimension of the set of dimensions for which the union of the digests' time ranges is a subset of (preferably equivalent to, but alternatively a strict subset of) the query time range, wherein each digest is generated using a histogram-preserving digest compression, and the plurality of digests are related in a hierarchical (e.g., tree) structure by dimension and/or time; merging the set of digests (and optionally recent process parameter data in a non-digest format) using a merging algorithm; determining an analysis (e.g., a histogram; a frequency; a measure of central tendency, such as a mean, median, and/or mode, etc.; a measure of dispersion, such as a standard deviation, a full-width at half maximum, a variance, a range, and/or an interquartile range, etc.; skewness; kurtosis; any other suitable descriptive statistic(s); etc.) of the merged set of digests; and providing the analysis to an endpoint through an interface. The method can additionally include generating a new digest for storage (e.g., after new process parameter data is received in the past hour). In a first example, determining digests associated with at least one dimension of the set of dimensions and for which the union of the digests' time ranges is a subset of the query time range can include: traversing the hierarchical (tree) structure to determine a lowest-resolution (broadest) digest encompassing the maximum amount of time and/or dimensions requested by the query without exceeding the query time range and/or queried dimensions; and determining digests that backfill the missing time range(s) and/or dimension(s), which can include backfilling in an iterative and/or recursive manner (e.g., wherein the missing data is treated analogously to an entire query range, traversing through the hierarchical structure to determine a lowest-resolution (broadest) digest encompassing the maximum amount of time and/or dimensions of the missing data without exceeding the missing data range, and then backfilling the still-missing data recursively). In a second example, determining digests associated with at least one dimension of the set of dimensions and for which the union of the digests' time ranges is a subset of the query time range can include: traversing the hierarchical (tree) structure (e.g., from the root, from a node known to encompass all data needed to satisfy the query, etc.), using a greedy approach to select any digest that falls entirely within the query range (e.g., the entire query range, the missing portion of the query range that is not contained within any of the digests that have already been selected, etc.), not searching any descendants of any selected digest (e.g., as each is a strict subset of the selected node, and so cannot contain any of the missing data), and continuing the traversal until the entire query range has been met (or until there are no more nodes to search, such as if the query range is not completely met by the selected nodes after the tree has been traversed in full).

Figure 2:
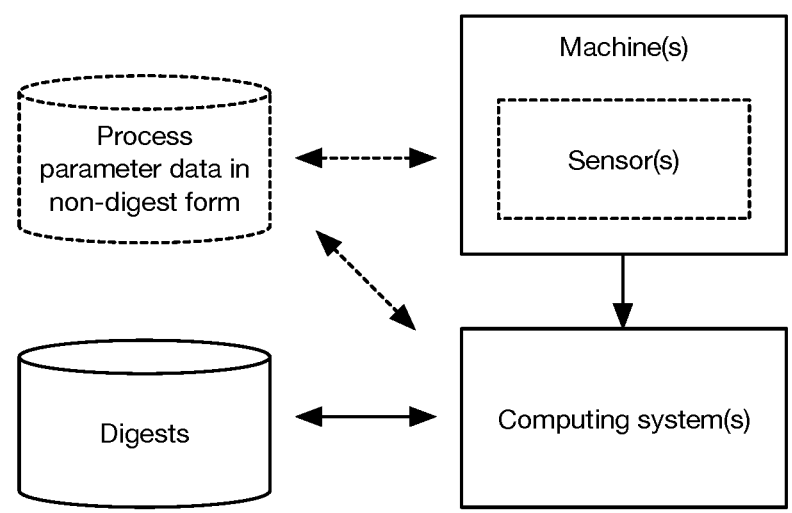
FIG. 2 is a schematic representation of a variant of the system.

As shown in FIG. 2, variants of the system for manufacturing system data analysis can include: a set of machines, a plurality of digests, and a set of computing systems. However, the system can additionally and/or alternatively include any other suitable components.

Although referred to herein as "process parameter data", a person of skill in the art will recognize that the technology described herein can additionally or alternatively be applied in an analogous manner to any other suitable manufacturing system data (e.g., product metric data).

2. Technical Advantages

Variants of the technology can confer several benefits over conventional systems and/or methods.

First, variants of the technology can enable rapid analysis of high-volume process parameter data while minimizing the amount of data stored and the response time. For example, the method can generate histogram digests for each process parameter data stream and/or combination thereof, using a histogram-preserving digest compression, for each of a set of time frames. Because the digests preserve the underlying histogram information, a query can be answered by selecting one or more digests (e.g., selecting a low-resolution digest and/or merging higher-resolution digests) to collectively generate the histogram data responsive to the query. In a second example, the process parameter data can be pre-labeled by the machines and sensors generating the raw data, which can remove a data labeling step.

Second, variants of the technology can increase computational speed by adjusting the resolution digests. In such variants, lower-resolution digests can be generated and preferentially used, and/or digests with higher-resolution that are less relevant over time can be cached, thereby decreasing the number of digests to search through, merge, and/or analyze.

Third, variants of the technology can be used to enable and/or assist with storage and/or analysis of information such as described in U.S. patent application Ser. No. 18/104,666, filed 1 Feb. 2023 and titled "METHOD FOR MANUFACTURING SYSTEM ANALYSIS AND/OR MAINTENANCE", which is herein incorporated in its entirety by this reference; for example, variants of the technology can be used to store a plurality of metric values and/or to determine representations (e.g., histograms) and/or statistical measures (e.g., descriptive statistics, such as statistics indicative of variance) of subsets of such metric values (e.g., subsets associated with one or more particular upstream elements, such as specific factory components and/or configuration parameters) such as described therein.

Fourth, variants of the technology can be used to facilitate practical and accessible long-term storage of information sufficient to enable a variety of post hoc analyses associated with manufacturing system operation. In many manufacturing systems (e.g., SMT manufacturing systems), process information may be generated/available at rates on the order of a billion data points per day (e.g., for an SMT manufacturing system producing one PCB assembly (PCBA) per minute, each such PCBA may be associated with approximately 10,000 data points, such as originating from approximately 5-10 measurements at each of approximately 1000-2000 locations). Typical technologies for manufacturing system data analysis may store only a limited subset of this information (e.g., store long-term in an accessible manner), such as storing only 1-10 data points for each product (e.g., rather than storing all potentially-relevant information, such as information indicative of approximately 10,000 different data points for each product), thereby limiting subsequent analyses to the stored information (e.g., limiting process control to 1-10 different metrics). In contrast, variants of the technology described herein can leverage advance knowledge of the predefined set of product parameters and process parameters, while maintaining flexibility to conduct arbitrary (or substantially arbitrary) post hoc analyses of relationships between these parameters, by pre-computing and storing digests (e.g., histogram-preserving digest compressions) for that limited predefined set of parameters (e.g., wherein the digests enable the desired flexibility to conduct post hoc analyses, without generating an impractical or undesirable burden to compute many different digests associated with an overwhelmingly large number of parameters).

Fifth, variants of the technology can enable rapid, practical, and/or efficient computation in response to a variety of queries relating to a limited number of different types of analyses (e.g., each related to a single descriptive statistic), such as limited to a single type of analysis (e.g., a single descriptive statistic, such as a standard deviation or other measure of dispersion). Accordingly, such variants may function to enable and/or facilitate studies (e.g., automated, semi-automated, and/or manual studies) directed toward determining which subset(s) of a population are responsible for large portions of the dispersion in that population (e.g., and along which dimensions and/or values thereof those subsets can be delineated). In typical approaches (e.g., without use of digests), computation in response to such queries would require storage of each of numerous datapoints (e.g., billions of datapoints) along with its associated labels, thereby enabling reconstruction of arbitrary subsets of the datapoints and computation of associated analyses in response to queries; further, in such typical approaches, the complexity of this computation would be $O(n)$, where n is the number of datapoints in the subset. In contrast, variants of the technology can enable storage of groups of data by pre-identified dimensions (e.g., rather than storing each datapoint individually), digested in a manner that supports computation of one or more of the desired analyses; further, such computation scales with complexity $O(N)$, where N is the number of digests in the subset (e.g., wherein any or all such digests may each account for a large number of datapoints, such as with any single digest potentially accounting for an entire hour, day, week, month, or year worth of datapoints belonging to the desired subset). Thus, such variants of the technology can function to significantly reduce the storage demands and/or computational complexity of answering unknown post-hoc queries about the origin of parameters distributions (and/or any other suitable characteristics of the parameters), without unduly limiting the specific allowable queries (e.g., as long as the dimensions are known in advance, which is typically the case in manufacturing contexts).

However, the technology can additionally or alternatively confer any other suitable benefits.

3. System

The system can include: a set of machines, a plurality of digests, a set of computing systems, and/or any other suitable components.

The set of machines (e.g., manufacturing robots) can function to produce physical products (e.g., components, electronics, etc.) in one or more manufacturing systems. In examples, a manufacturing system can include one or more: manufacturing lines, factories, supply chains (e.g., including multiple factories), and/or any suitable subsets thereof. Each manufacturing system (e.g., factory) can include one machine, multiple machines, and/or any other suitable number of machines. An entity (e.g., electronics) can have one manufacturing system, multiple manufacturing systems, and/or any other suitable number of manufacturing systems. Each machine can be: a machine (e.g., etch machine, diffusion machine, evaporation machine, deposition machine, etc.), one or more components (e.g., pipes, motors, pedals, manifolds, chambers, pumps, chillers, air purifiers, switches, actuators, etc.), a machine control system (e.g., that control machine or component operation), and/or any other suitable machine. Each machine can include: one sensors, multiple sensors, and/or any other suitable number of sensors (e.g., sensors that monitor machine operation). Each sensor can generate a timeseries of process parameter values, a sensor identifier, a machine identifier, and/or any other suitable information. Examples of sensors can be: accelerometers, gyroscopes, IMUs, magnetometers, altimeters, touchscreens, optical sensors, pressure sensors, flow sensors, Hall effect sensors, voltage meters, inductive sensors, capacitive displacement sensors, laser sensors, confocal sensors, GPS receivers, cameras, microphones, cameras, and/or any other suitable sensors. The sensors can be sampled at a sampling rate (e.g., the same rate, different rates, etc.), such as to determine signals. The sampling rate can be low (e.g., 5, 10, 15, 30, 60, or 120 seconds, greater than 120 seconds, any suitable value within a range bounded by any two of the aforementioned values, etc.), high (e.g., 1, 2, 5, 10, 20, 50, 100, 200, 500, or 1000 ms, less than 1 ms, any suitable value within a range bounded by any two of the aforementioned values, etc.), or intermediate (e.g., between 1-5 seconds); alternatively, sampling can be performed sporadically (e.g., irregularly), in response to one or more triggers, and/or with any other suitable timing.

Each machine can generate a set of values for each dimension of a set of dimensions (or for any suitable subset thereof). The dimensions can be discrete manufacturing dimensions, electronics manufacturing dimensions, and/or be any other suitable set of dimensions. Examples of dimensions can include: time, machine, running program (e.g., as a proxy for what is being built and/or the specific instructions by which it is being built), work order (e.g., identifier indicative of a particular production run), unit serial number, unit location (e.g., board position within an array of boards batched together into a panel, such as 1-N, which can, in some examples, enable comparison of identical units processed contemporaneously), component/subassembly production and/or historical information (e.g., information specific to the production, origin, and/or history of a component or subassembly, such as: work order, serial number, lot, supplier, timestamp, date code, time and/or date of production, time and/or date of delivery, storage location, bin number, etc.), component reference designator (e.g., R15), measurement location (e.g., exact place or object measured such as R15 pin 1; any suitable group of nearby measurement locations such as all measurement locations (or all locations for measurements of a particular kind) within a 1 inch square centered at a particular location; any other suitable group of measurements; etc.), defective (e.g., whether the measurement was flagged as defective by the machine), parameter name (e.g., name indicative of the measurement, typically a process parameter name or product parameter name, such as: inlet pressure, solder paste volume, placement offset error, etc.), defects/mispicks (e.g., whether the machine detects it misplaced a component, whether the machine detects a downstream inspection machine labels the placement as defective, etc.), feeder serial (e.g., identifier of the feeder part was pulled from), feeder location (e.g., location on the side of the machine feeder was attached to), feeder size (e.g., size of the feeder, 8 mm, 44 mm, etc.), nozzle serial (e.g., serial number of the nozzle that placed the part), nozzle location (e.g., location of the nozzle on its head, position 1 through 24 for a 24-nozzle head, etc.), head serial (e.g., serial number of the head with the problem), head location (e.g., location of the head in the machine, 1 to 4 typically at most, etc.), camera serial (e.g., serial number of the camera used for placing the part), camera position (e.g., location of the camera used for placing the part, such as a position index), part number (e.g., the part number being placed), part shape (e.g., code corresponding to one of a predefined set of component shapes, such as a string that identifies common programming of all shapes with the same name), solder paste stencil information such as aperture shape (e.g., code indicative of the aperture shape, such as a string shared by all apertures of that shape) and/or stencil identifier (e.g., individual stencil serial number, stencil type identifier, etc.), reel barcode (e.g., what component reel to permit tracking), error code (e.g., what was the exact error code), error code after manual review (e.g., whether the operator changed the defect classification after review), false call (e.g., whether the operator manually passed the product because the operator assessed the machine flagged detect as incorrect), and/or any other suitable parameter, attribute, state, or piece of information. Additional examples of possible dimensions are described below (e.g., regarding process parameters and/or product parameters).

In some examples, any or all such dimensions can be associated with one or more components and/or subassemblies used in fabrication of a larger assembly (e.g., wherein a first such component (or subassembly) may be associated with a first component work order, serial number, storage location, and a first component test characteristic such as a capacitance; whereas a second such component (or subassembly) may be associated with a second component work order, production date, storage location, arrival date at the storage location, and one or more second component test characteristics such as gain and/or coupling ratio).

The dimension data determined from the machines can be determined: at a predetermined frequency (e.g., high sampling rate), responsive to occurrence of a predetermined event (e.g., defect detection), and/or at any other suitable time. The dimension data can be stored after each sample collection, after a predetermined period of time, after a predetermined change between samples is detected (e.g., such that the sampling rate is high by the stored data is sparse), and/or stored at any other suitable time. The dimension data can be stored: in raw format, as a digest (e.g., a histogram, a set of histogram parameters, etc.), and/or in any other suitable format.

Process parameters can be semantic (e.g., process parameters that associate measurement data with meaning) and/or or non-semantic. Examples of process parameters can include one or more of: current, temperature, speed, pressure (e.g., inlet, outlet, etc.), vibration, gas flow rates, state (e.g., open or closed, % open, etc.), duration, position (e.g., angular position, linear position, etc.), displacement (e.g., actual position compared to an expected position), torque, stress, load, work, and/or any other suitable process parameter, as well as derivatives thereof (e.g., derivatives with respect to time, with respect to one or more spatial dimensions, etc.); cycle time (e.g., time elapsed making a product); injection molding parameters (e.g., pressure during hold, pressure during fill, temperature during hold, temp during fill, time to fill, time to hold, etc.). The process parameters can be measured by the one or more sensors, simulated, and/or otherwise determined. The process parameters are preferably common to multiple machines, but can alternatively not be common to multiple machines. Each process parameter value can be associated with: values for one or more labels (e.g., entity(s) involved, machine, unit serial number, unit location, component reference designator, etc.), a time range and/or timestep, and/or any other suitable information. The process parameter data can be stored in volatile memory, persistent memory, hot storage, cold storage, and/or any other suitable storage. The hot and/or cold storage can be: a local storage, a cloud storage, and/or any other suitable storage. In a first example, most recent process parameter data sampled within less than an hour is stored in a non-digest format in hot storage. In a second example, additional or alternative to the first example, process parameter data that has been converted into a digest format is stored in cold storage.

Product parameters can include parameters indicative of characterizations (e.g., from test, inspection, and/or metrology equipment) of the product and/or elements thereof (e.g., components and/or subassemblies), component/subassembly production and/or historical information (e.g., information specific to the production, origin, and/or history of one or more components and/or subassemblies contained within the product), and/or any other suitable parameters associated with a product. In some examples, in addition to a measured value, a product parameter can include (and/or be associated with or otherwise indicative of) any or all of: parameter name, ideal value, low limit, and/or high limit. Examples of product parameters can include one or more of: component position (e.g., lateral displacement from a target location, such as total displacement and/or displacement along one or more reference axes, preferably in-plane axes but additionally or alternatively one or more out-of-plane axes such as a plane-normal axis) and/or orientation (e.g., angular displacement from a target orientation, such as total angular displacement and/or angular displacement about one or more reference axes, preferably a plane-normal axis but additionally or alternatively any other suitable axes); electrical metrics (e.g., resistance, capacitance, inductance, voltage, etc.) associated with one or more components, networks, circuits, traces, and/or reference points; functional test metrics (e.g., gain, noise, bandwidth, isolation, coupling ratio, characteristic frequencies such as resonance frequencies and/or cutoff frequencies, etc.); solder paste deposit size (e.g., volume, width, length, height), position (e.g., lateral displacement from a target location, such as total displacement and/or displacement along one or more reference axes, preferably in-plane axes; distance between solder paste deposits such as smallest distance, which can be indicative of a near-bridging condition; etc.), and/or orientation (e.g., angular displacement from a target orientation, such as total angular displacement and/or angular displacement about one or more reference axes, preferably a plane-normal axis); production and/or historical information (work order, serial number, lot, supplier, timestamp, date code, time and/or date of production, time and/or date of delivery, storage location, bin number, etc.); and the like. The product parameter data can be stored in volatile memory, persistent memory, hot storage, cold storage, and/or any other suitable storage. The hot and/or cold storage can be: a local storage, a cloud storage, and/or any other suitable storage. In a first example, most recent product parameter data sampled within less than an hour is stored in a non-digest format in hot storage. In a second example, additional or alternative to the first example, product parameter data that has been converted into a digest format is stored in cold storage.

In some examples, the dimensions can additionally or alternatively include one or more parameters described in U.S. patent application Ser. No. 18/217,757, filed 3 Jul. 2023 and titled "METHOD FOR MANUFACTURING SYSTEM ANALYSIS AND/OR MAINTENANCE", which is herein incorporated in its entirety by this reference.

However, the set of machines can be otherwise configured.

The plurality of digests can function to store the dimension data. For example, each digest stores a timeseries of combinations of one or more process parameter values.

Each digest is preferably a representation of a histogram, but can additionally and/or alternatively be a representation of individual data points, a representation of any other suitable datum. Each digest can store histogram feature values (e.g., percentiles, quantiles, shape features, derivative values, etc.) or not store histogram feature. Each digest preferably has a fixed-size representation of any histogram, but can alternatively have a variable-size representation of any histogram.

The digests can be generated using a histogram-preserving digest compression (e.g., lossless histogram compression), but can additionally and/or alternatively be generated using any other suitable lossless or lossy compression method. For example, each digest is compressed in a histogram-preserving manner such that when the respective digest is merged with a different digest, the merged digest is an equivalent digest from all of their (e.g., respective digest and different digest's) data points. Examples and/or types of digests can be: t-digests, q-digests, and/or any other suitable digest type.

Each digest can be associated with a time range (e.g., from time A to time B, from time-date-month-year X to time-date-month-year Y, from week C to week D, etc.) or not be associated with a time range. The duration (e.g., an hour, a day, a week, a month, a year, etc.) of time ranges for all digests can be the same, or some or all digests can have different time ranges. The minimum duration of time ranges for all digests is preferably an hour, but can additionally and/or alternatively be a second, a minute, a day, a week, a month, a year, and/or any other suitable time length. For example, most recent process parameter data sampled within less than a threshold time (e.g., an hour) typically has not been aggregated into a digest yet (since the minimum duration of time ranges has not been satisfied); instead, this most recent data can be stored as (e.g., stored only as) individual data points. The timestep durations (e.g., a second, a minute, an hour, a day, a week, a month, a year, etc.) within the time range (e.g., sampling time between each process parameter value in digest) are preferably the same, but can alternatively be different.

Each digest can be associated with a set of dimensions. The dimensions within each set can be determined: randomly, according to a set of rules, manually determined, learned (e.g., the set includes commonly-queried dimension combinations), and/or otherwise determined. For example, each dimension can include set of digests specific to the dimension, and can also be associated with other digests that include the dimension data. The dimension data within the same digest is preferably from the same time period, but can alternatively be from different time periods.

Each digest can be associated with a set of dimension values, or not be associated with a set of dimension values. The set of dimension values is preferably a unique combination of a set of dimensions and a time range (e.g., digests associated with a given unique set of dimensions do not have overlapping time ranges), but can additionally and/or alternatively be multiple combinations of a set of dimensions and a time range, and/or otherwise configured. Each digest can be associated with a digest identifier (e.g., unique digest identifier, non-unique digest identifier, etc.) or not be associated with a digest identifier.

The system can include one or more digests for each: time range, dimension time series, combination of process parameters, and/or for any other suitable set of data. The digests can be overlapping or nonoverlapping in: time, set of components, dimensions, and/or in any other suitable datum. The digests are preferably related in a hierarchical structure, but can additionally and/or alternatively be related in a random structure, a sequential structure, a flat structure, and/or otherwise related.

Figure 5A:
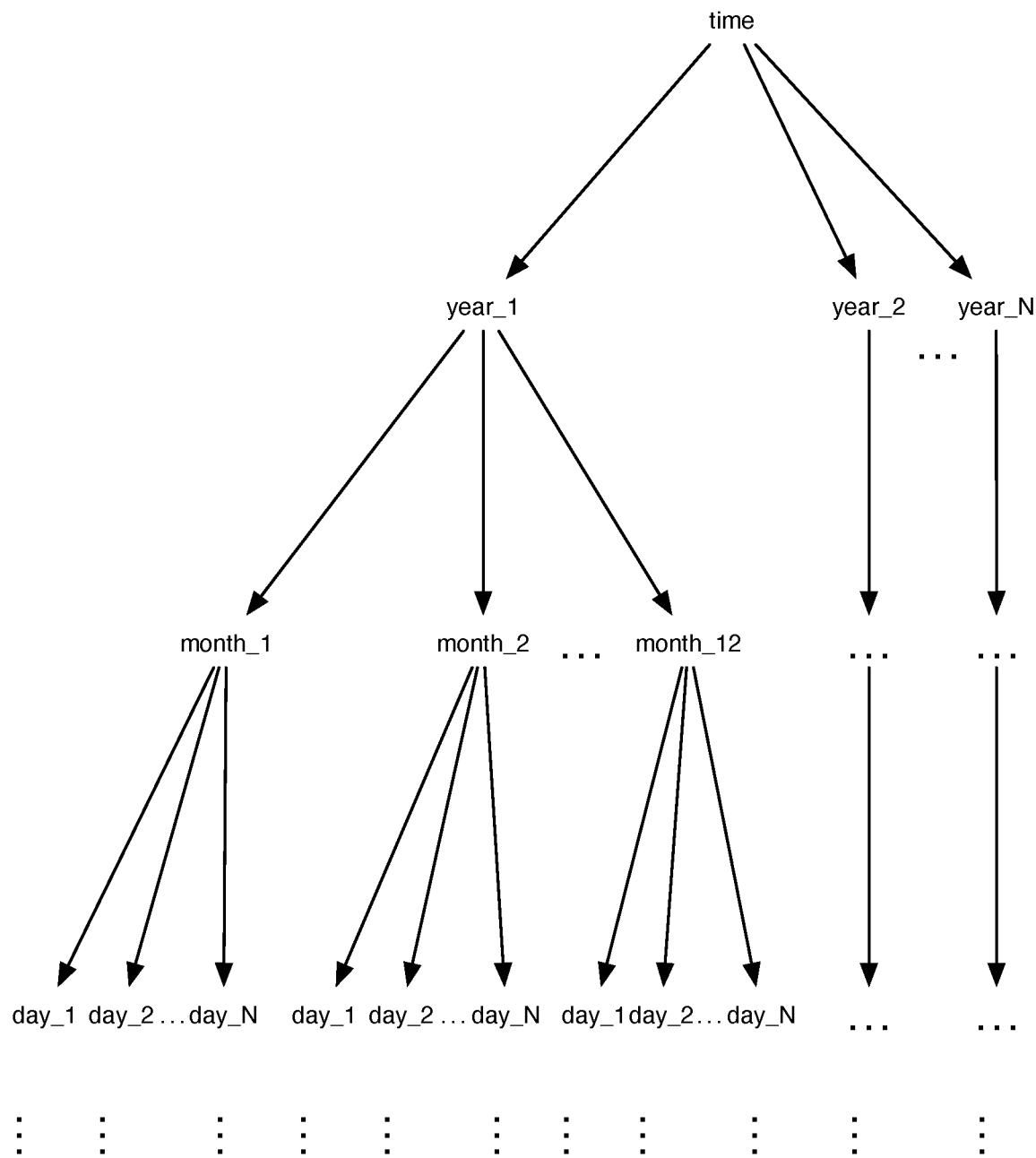
FIGS. 5A-5B depict illustrative examples of a first and second example, respectively, of digests related in a hierarchical structure by time.
Figure 5B:
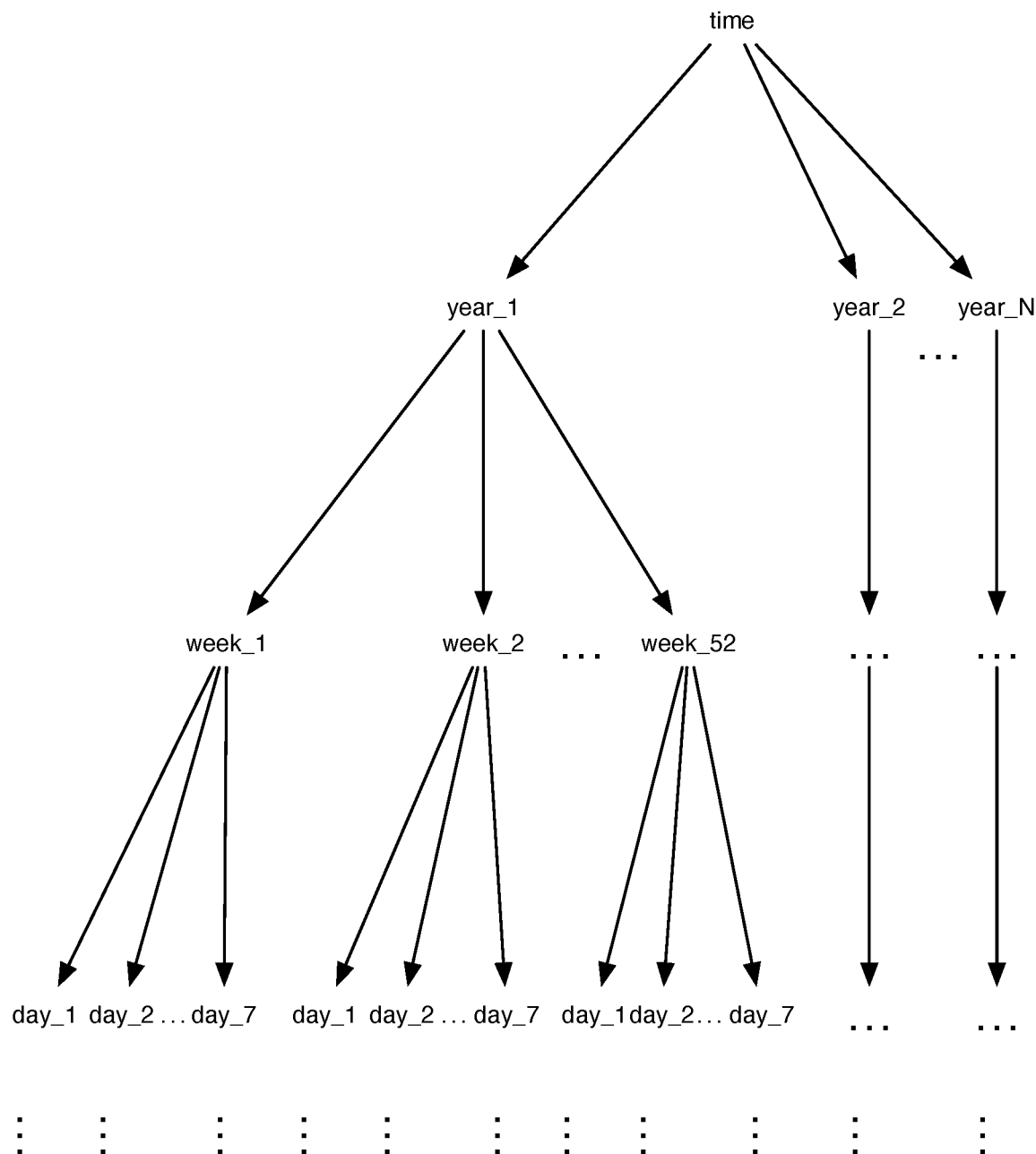

In a first variant, the digests are related in a hierarchical structure by time (e.g., in a tree form from top to bottom of the tree, which can include any or all of: year, month, week, day, hour, etc.; examples shown in FIGS. 5A-5B). In an illustrative example, different digests can represent dimension data values from hierarchically overlapping time ranges, wherein each child digest can encompass a temporal subset of the dimension data represented by a parent digest. In a second illustrative example, different digests can cover different but overlapping timeframes.

Figure 6:
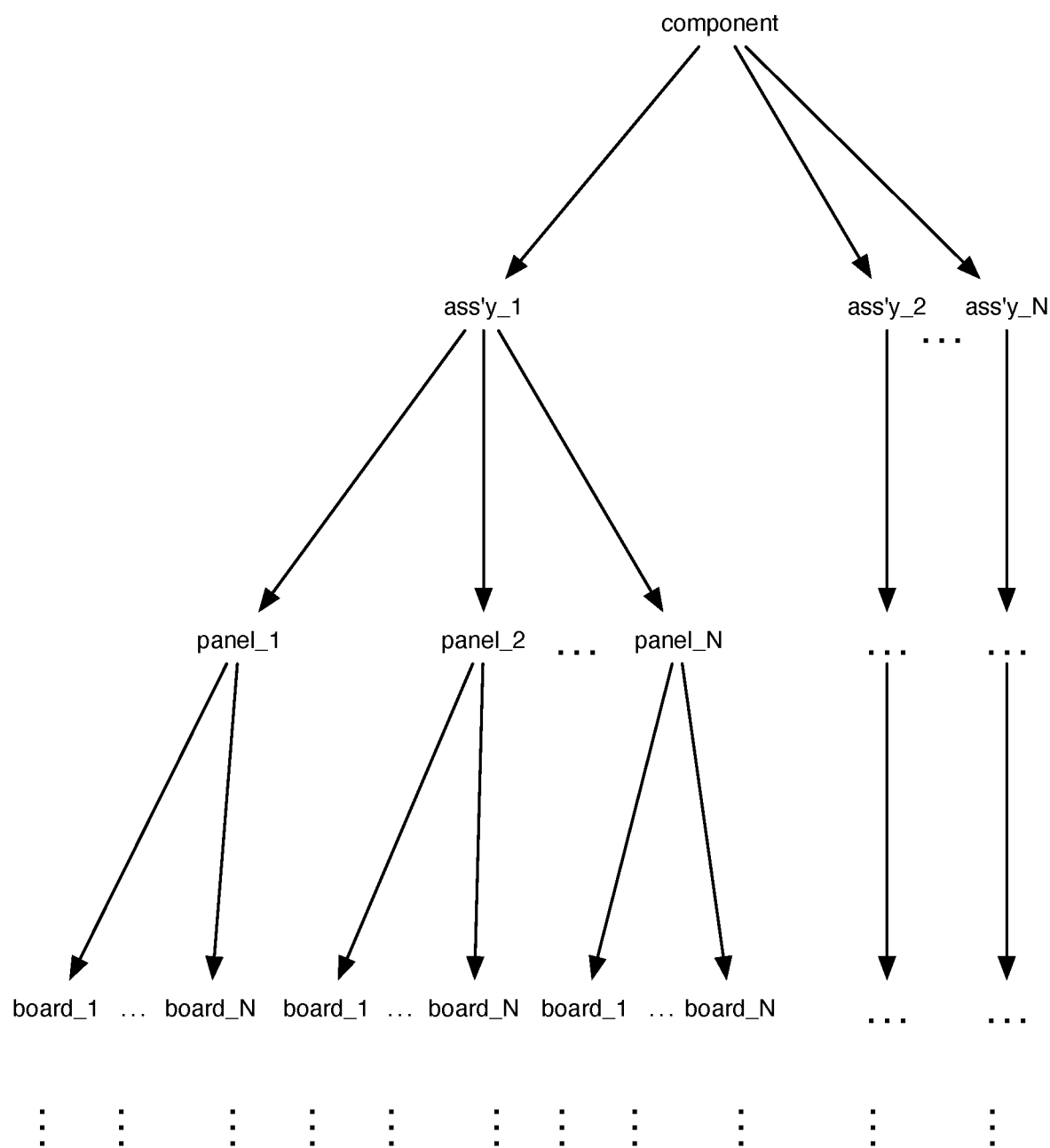
FIG. 6 depicts an illustrative example of digests related in a hierarchical structure by component.

In a second variant, the digests are related in a hierarchical structure by component (e.g., in a tree form from top to bottom of the tree: assembly, panel, board, component, pad, shape; example shown in FIG. 6). In an example, different digests can represent dimension data values from different component levels, wherein each child digest includes the dimension data for a subset of the components represented by a parent digest. In an illustrative example, the digests for a product can include: a package-level digest, a set of board-level digests (e.g., for each board), and a set of chip-level digests (e.g., for each chip on each board).

Figure 7A:
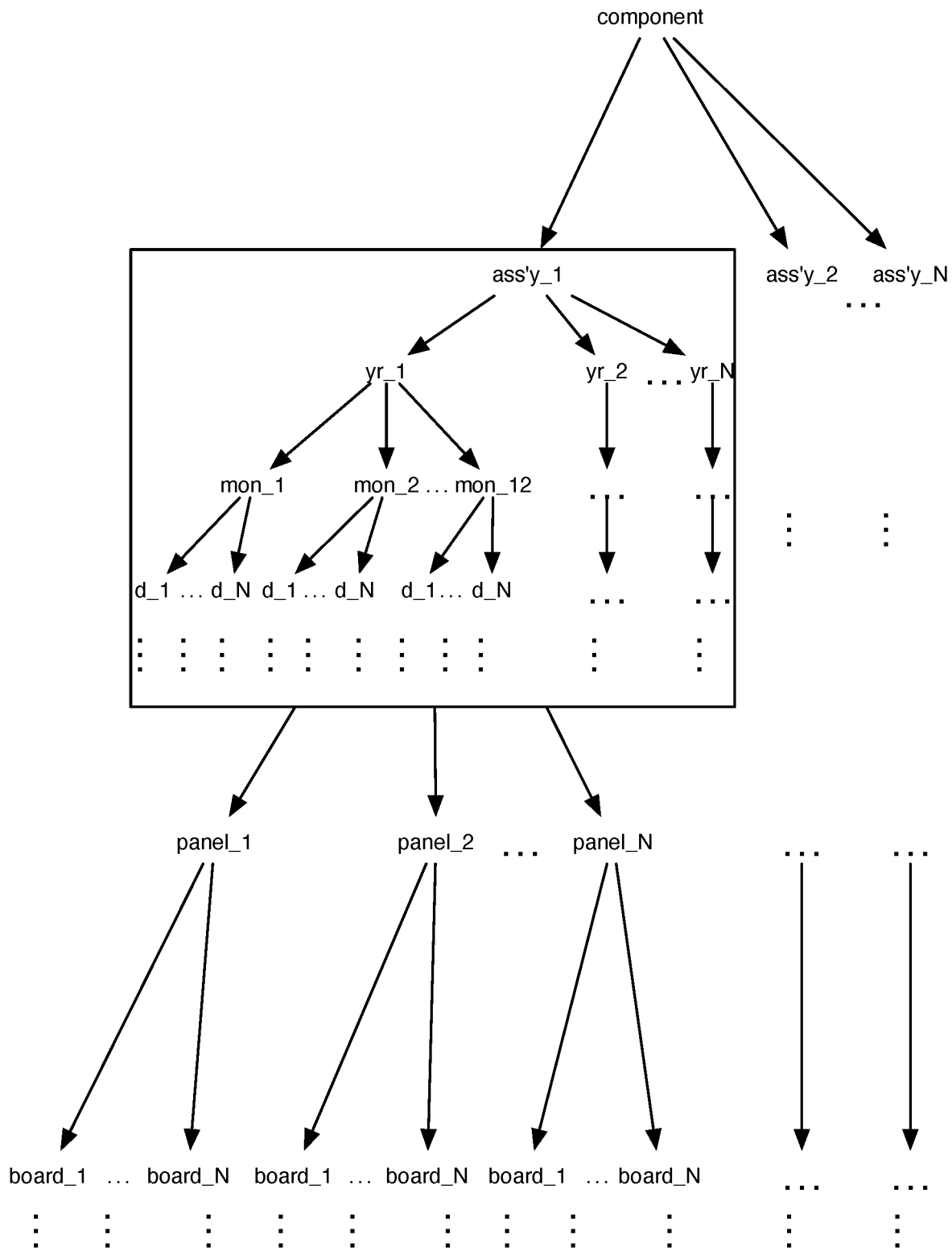
FIGS. 7A-7B depict a first and second illustrative example, respectively, of digests related in a hierarchical structure by component and time.
Figure 7B:
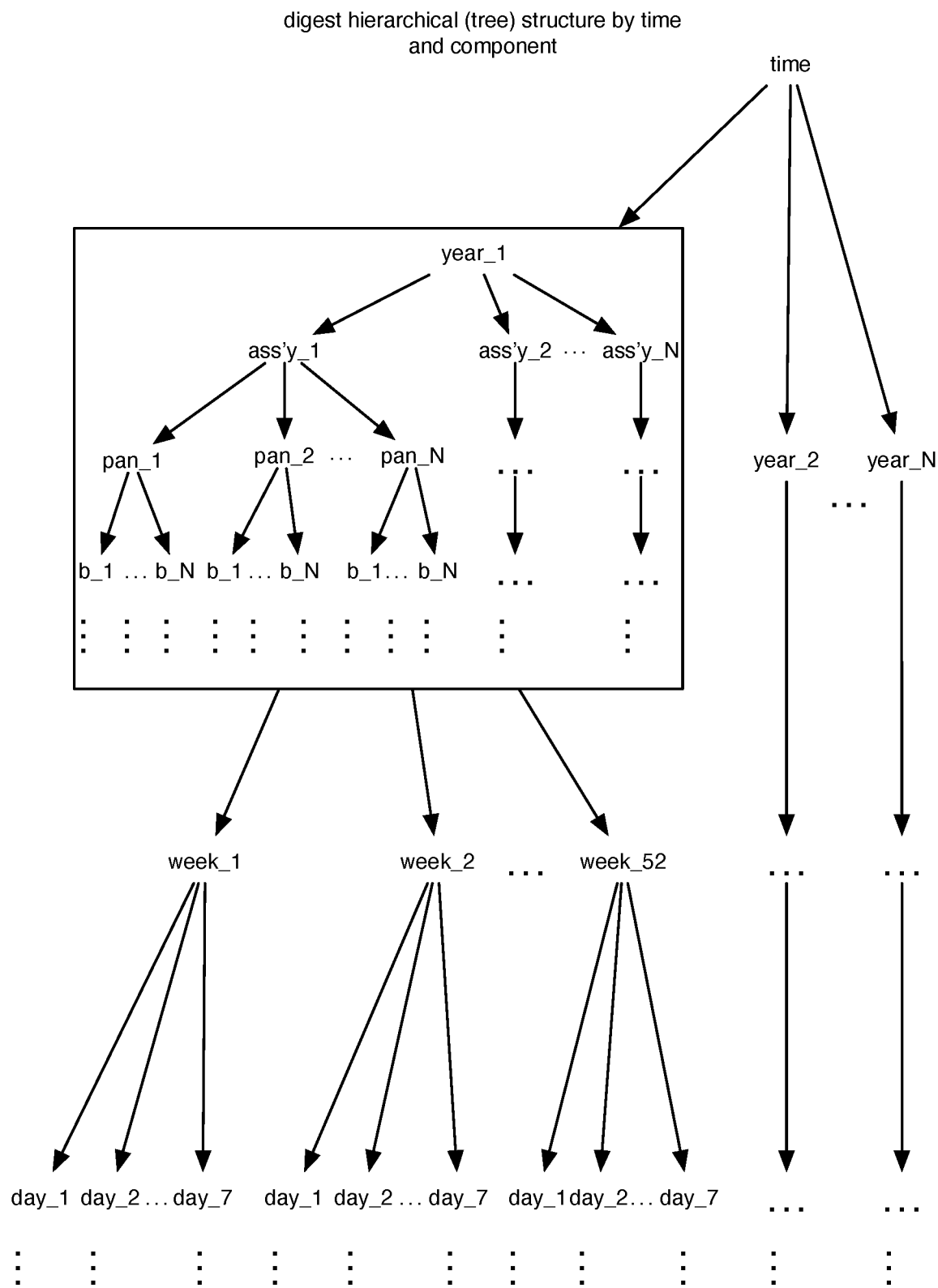

In a third variant, the digests are related in a hierarchical structure by both time and component. In a first such example, each component-based digest node (e.g., component-specific node, assembly-specific node, panel-specific node, board-specific node, etc.) of the hierarchical structure (or any suitable subset of such nodes) can be associated with (e.g., be the parent node of) an entire time-based hierarchical structure for which the digests are limited in component to the scope of the associated component-based parent node (e.g., as shown in FIG. 7A). In a second such example, each time-based digest node (e.g., year-specific node, month-specific node, week-specific node, day-specific node, hour-specific node, etc.) of the hierarchical structure (or any suitable subset of such nodes) can be associated with (e.g., be the parent node of) an entire component-based hierarchical structure for which the digests are limited in time to the scope of the associated time-based parent node (e.g., as shown in FIG. 7B).

However, the digests can additionally or alternatively be related in any other suitable manner, or can alternatively not be related.

The resolution of digests can be fixed, be adjusted based on time and/or age, and/or be otherwise adjusted. In a first example, digests associated with a time range over a week ago with timestep durations of an hour are cached (e.g., not related to other digests within the hierarchical structure) or used to generate a higher-level digest (e.g., summarizing a longer temporal duration). In a second example, digests associated with a time range over a year ago with timestep durations of a week, a day, and an hour are cached.

Figure 4:
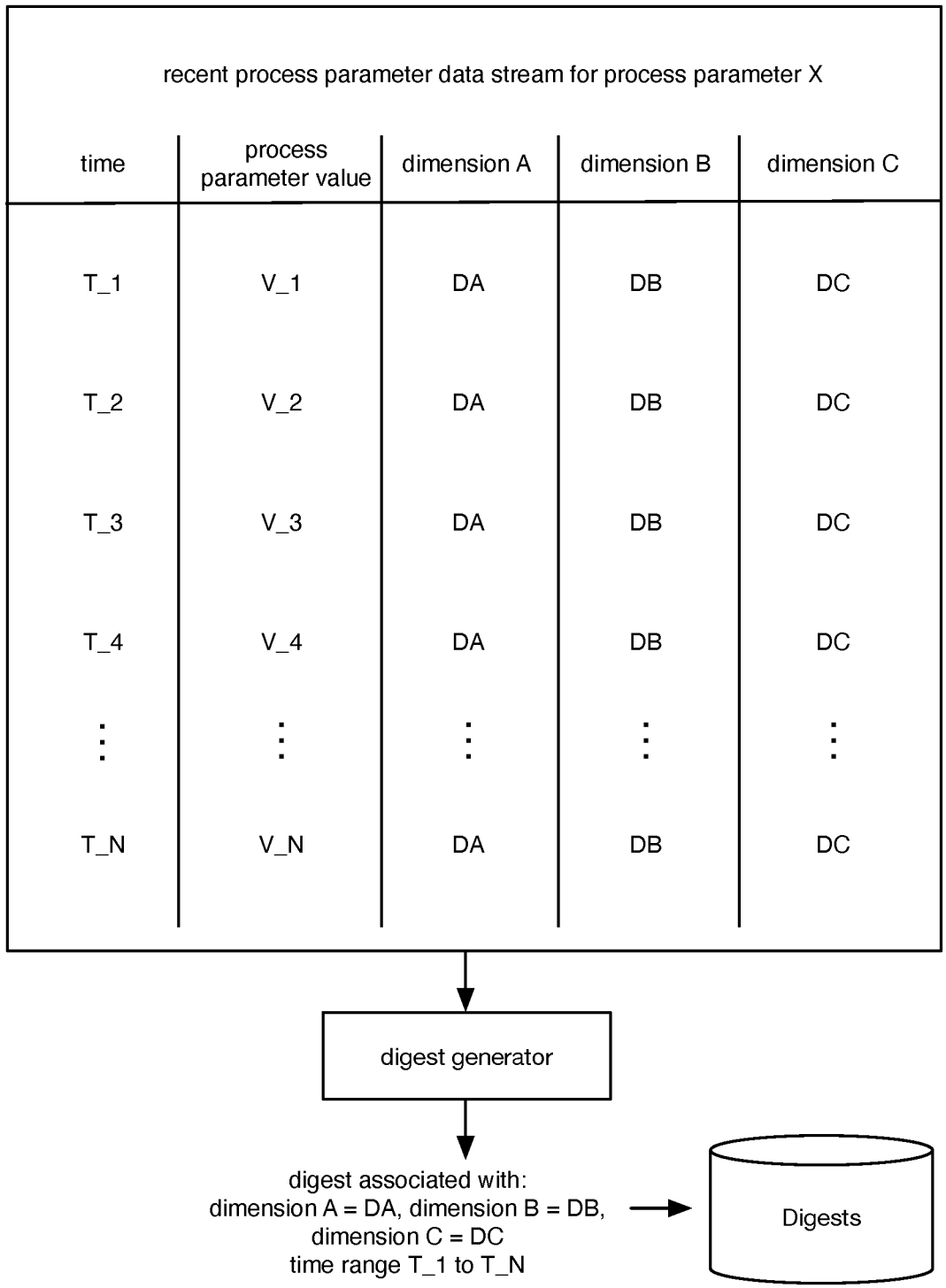
FIG. 4 depicts an illustrative example of generating a new digest.

New digests can be generated: after a predetermined period of time (e.g., after new dimension data is received in the past hour; example shown in FIG. 4); responsive to occurrence of an event (e.g., more than a threshold amount of memory is occupied; manual request to summarize; etc.); and/or at any other time. New digests can be generated: from raw data, consolidated from lower-level digests, and/or from any other suitable data. For example, weekly digests can be generated by consolidating daily digests and/or hourly digests on a weekly, biweekly, monthly, or other basis. In another example, monthly digests can be generated by consolidating weekly digests, daily digests, and/or hourly digests (e.g., at the end of the year, at the end of the month, etc.). However, the digests can be otherwise generated. The new digest is preferably stored in cold storage, but can additionally and/or alternatively be stored in hot storage.

A database (e.g., hot storage, cold storage, etc.) can be queried to retrieve: digests, process parameter data in a non-digest format (e.g., process parameter data in the past hour stored in hot storage), and/or any other suitable information used to perform the method. The query can include: a set of dimension values (e.g., a time range and a set of dimensions), a time range, a set of non-time dimensions, a set of digest identifiers, a database identifier, and/or any other suitable information. The database can be centralized or decentralized.

However, the plurality of digests can be otherwise configured.

The set of computing systems can function to execute all or portions of the method, and/or perform any other suitable functionality. The system can include one computing system, multiple computing systems, and/or any other suitable number of computing systems. Each computing system can be: a remote computing system (e.g., one or more servers, one or more platforms, etc.), a local computing system (e.g., a machine includes a computing system), a user device (e.g., smartphone, laptop, desktop, tablet, etc.), and/or any other suitable computing system. The computing system can be used with a user interface (e.g., mobile application, web application, desktop application, API, database, etc.) or not be used with a user interface.

However, the set of computing systems can be otherwise configured.

However, the system can be otherwise configured.

4. Method

The method preferably includes receiving a query S100, determining a set of digests S200, and/or determining a query result S400, and can optionally include merging the set of digests S300 and/or providing the query result S500. Further, the method can additionally or alternatively include any other suitable elements. One or more instances of the method can be repeated for different queries, set of dimensions, set of dimension values, time ranges, and/or otherwise be repeated.

The method can function to respond to a query (e.g., respond based on information determined from one or more digests). The method is preferably performed by the system described above, but can additionally and/or alternatively be performed by any other suitable system(s). All or portions of the method can be performed at: one or more computing systems, one or more machines (e.g., when the machine includes a computing system), one or more user devices, and/or any other suitable computing systems.

4.1 Receiving a Query

Receiving a query S100 can function to initiate a query evaluation process such that a query result can be returned. The query can be received from: a user through an API, a computer, a platform, and/or any other suitable source. The query can be generated manually and/or automatically. The query preferably includes a set of dimension values, such as a time range (e.g., from time A to time B) and a set of dimensions (e.g., machine, unit serial number, unit location, component reference designator, etc.), but can additionally and/or alternatively include only a time range, only a set of dimensions, a timestep duration, a set of digest identifiers, and/or any other suitable component.

However, the query can additionally or alternatively be received in any other suitable manner.

4.2 Determining a Set of Digests

Determining a set of digests S200 can function to identify a set of digests (e.g., from a plurality of digests) and/or raw data that can answer the query. Each dimension of the set of dimensions is preferably a dimension as described above, but additionally and/or alternatively be any other suitable dimension. The set of digests are preferably automatically determined, but can additionally and/or alternatively be manually determined (e.g., selected by a user). The set of digests is preferably determined based on a query (e.g., received query in S100), but can additionally and/or alternatively be randomly selected.

S200 can include determining a set of dimension values, such as a query time range and a set of queried dimensions, from the query; and retrieving a set of digests that collectively encompass the queried time range and the queried dimensions. The resultant set of digests can encompass more time than the query time range, less time than the query time range, exactly the query time range, more dimensions than the queried dimensions, less dimensions than the queried dimensions, exactly the queried dimensions, and/or be otherwise related to the queried values. Preferably, the resultant set of digests do not exceed the queried time range (or alternatively, do not substantially exceed the queried time range), more preferably matching the queried time range as closely as possible (e.g., the union of the digests' time ranges falls within the query time range, such as encompassing all or almost all of the query time range; the union of the digests' time ranges is a subset of the query time range, wherein, if the union is a strict subset of the query time range, the difference may in some cases be filled in, in part or in whole, by non-digested data), such as shown by way of examples in FIGS. 8A-8C. However, the resultant set of digests can alternatively exceed the queried time range and/or have any other suitable relationship to the queried time range (e.g., the query time range falls within the union of the digests' time ranges, such as encompassing all or almost all of the union; the query time range is identical or substantially identical to the union of the digests' time ranges; the query time range is as close as possible to the union of the digests' time ranges, but wherein either or both may include times that lie outside the other, such as wherein neither is a subset of the other; etc.) and/or may have any other suitable relationship to the queried time range.

In variants, raw data can optionally be included in the set of digests, such as when real-time or up-to-date analytics are requested. These variants can be useful when raw data is summarized into digests asynchronously and/or periodically. However, S200 can be otherwise performed.

Figure 9A:
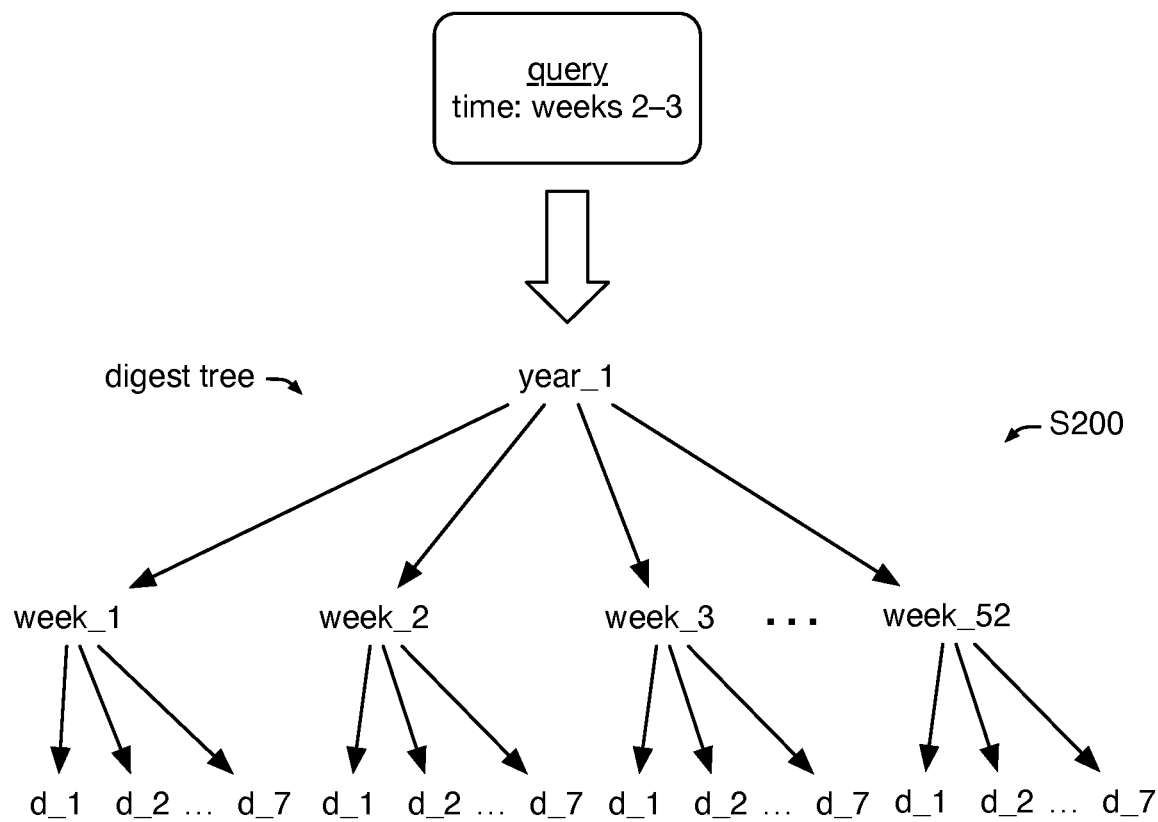
FIGS. 9A-9B depict a first and second example, respectively, of determining a set of digests.
Figure 9B:
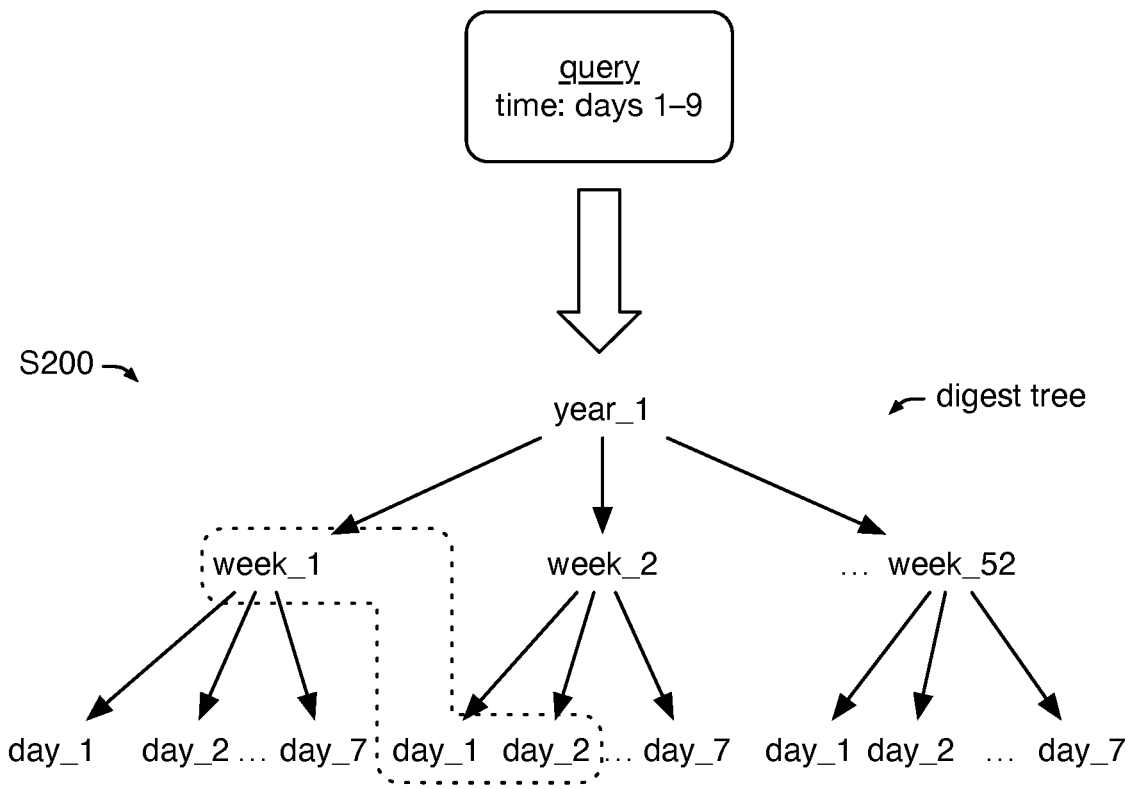

In a first variant, the set of digests can be determined by optimizing for a minimum number of digests to be merged, optimizing for speed, optimizing for computational efficiency, applying a set of digest selection rules, and/or otherwise determined. For example, S200 includes: determining a lowest-resolution digest (e.g., highest-order digest) encompassing a maximum proportion of the set of dimension values requested by the query (e.g., without exceeding the query time range and/or queried dimensions); and determining digests that backfill the missing dimension values of the set (e.g., the missing time range(s) and/or dimension(s)), wherein the lowest-resolution digest and the backfilling digests cooperatively encompass the entirety of the queried set of dimension values (e.g., queried time range and queried dimensions), or alternatively, encompass as much of the queried set as possible (e.g., based on digest availability, wherein, in some examples, some or all missing data may be filled in using non-digested data). This can include backfilling in an iterative and/or recursive manner (e.g., wherein the missing data is treated analogously to an entire query range, traversing through the hierarchical structure to determine a lowest-resolution (broadest) digest encompassing the maximum amount of time and/or dimensions of the missing data without exceeding the missing data range, and then backfilling the still-missing data recursively). In a specific example, when all existing digests are related in a hierarchical (tree) structure, determining a lowest-resolution digest includes traversing the hierarchical (tree) structure to identify the lowest-resolution digest (e.g., starting from the root node or a node known to encompass the entire query range, descending through the tree, typically using a breadth-first search, until finding a digest that does not exceed the query range, wherein this digest is selected as the lowest-resolution digest, such as shown by way of example in FIGS. 9A-9B; starting from a leaf node or a node known to fall entirely within the query range, ascending through the tree until finding a digest that exceeds the query range, then backtracking to the child node from which that digest was reached, wherein the digest of that child node is selected as the lowest-resolution digest; etc.).

In a second variant, determining digests associated with at least one dimension of the set of dimensions and for which the union of the digests' time ranges is a subset of the query time range can include: traversing the hierarchical (tree) structure (e.g., from the root, from a node known to encompass all data needed to satisfy the query, etc.), using a greedy approach to select any digest that falls entirely within the query range (e.g., the entire query range, the missing portion of the query range that is not contained within any of the digests that have already been selected, etc.), not searching any descendants of any selected digest (e.g., as each is a strict subset of the selected node, and so cannot contain any of the missing data), and continuing the traversal until the entire query range has been met (or until there are no more nodes to search, such as if the query range is not completely met by the selected nodes after the tree has been traversed in full).

In a third variant, S200 can include randomly selecting a starting digest that falls within the queried set of dimension values, then backfilling digests until the query set of dimension values are encompassed.

In a fourth variant, S200 can include determining a set of digest identifiers from the query (e.g., wherein the query includes digest identifiers), and retrieving a digest associated with each digest identifier of the set of digest identifiers to determine the set of digests.

However, the set of digests can be otherwise determined.

4.3 Merging the Set of Digests

Merging the set of digests S300 can function to combine the set of digests to determine a faster and more computationally efficient query result. The digests of the set preferably have the same compression size and/or compression ratio, but can alternatively have different compression sizes and/or compression ratios. The set of digests is preferably automatically merged, but can additionally and/or alternatively be manually merged. The set of digests can be merged using a merging algorithm (e.g., naïve; using a merging algorithm specific to the digest type such as t-digest or q-digest; etc.), but can additionally and/or alternatively be otherwise merged.

Figure 8A:
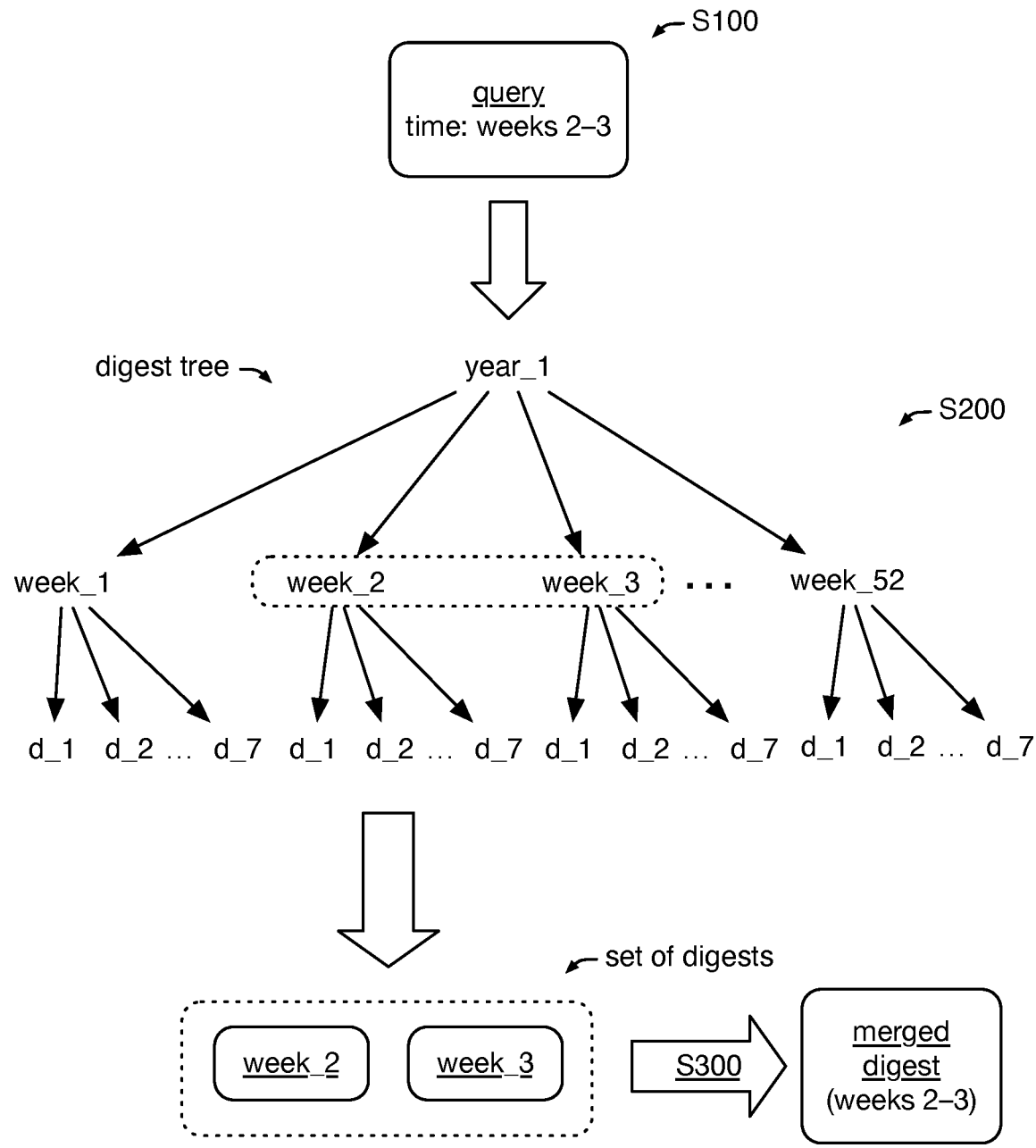
FIGS. 8A-8C depict a first, second, and third example, respectively, of a portion of the method.
Figure 8B:
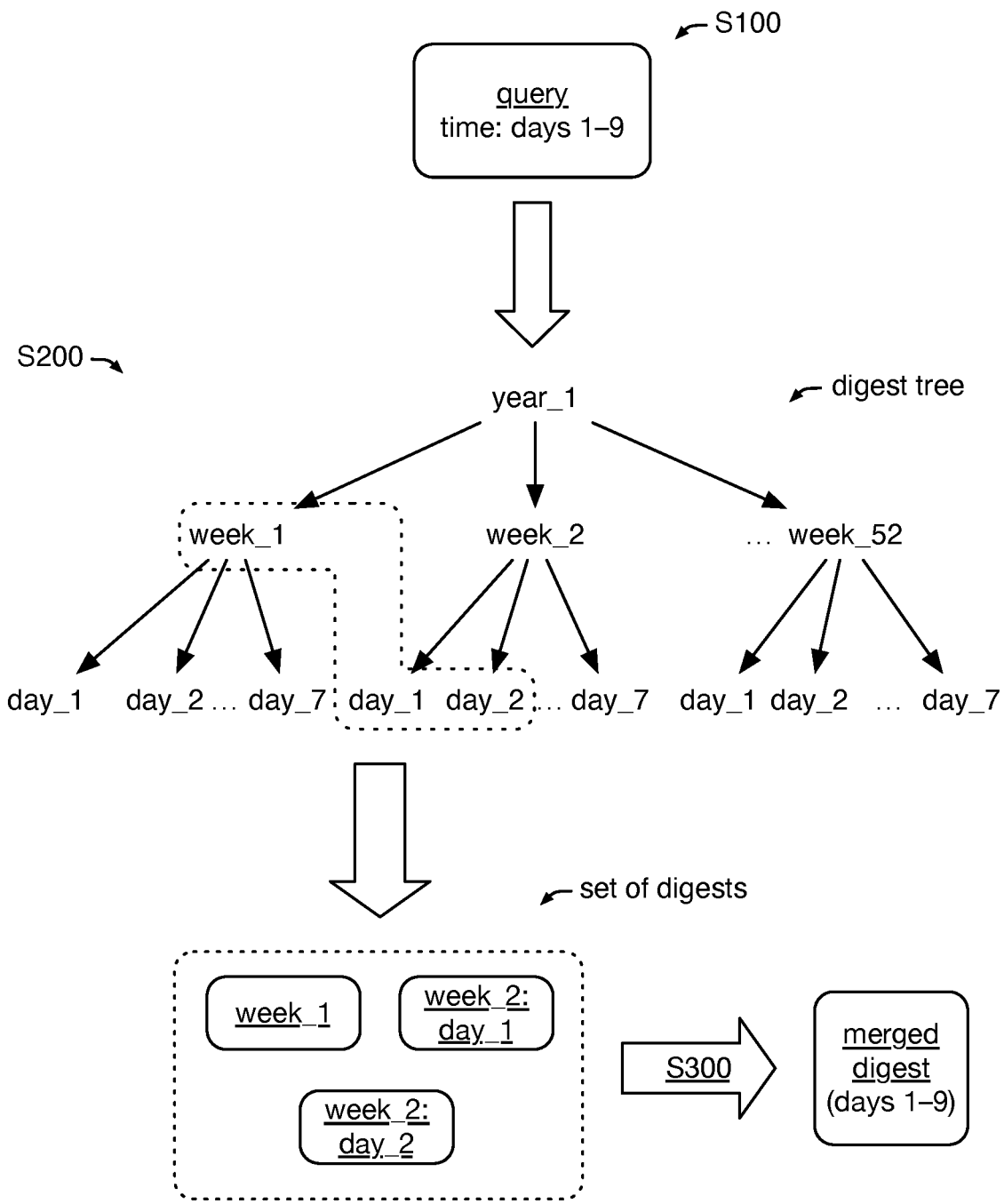
Figure 8C:
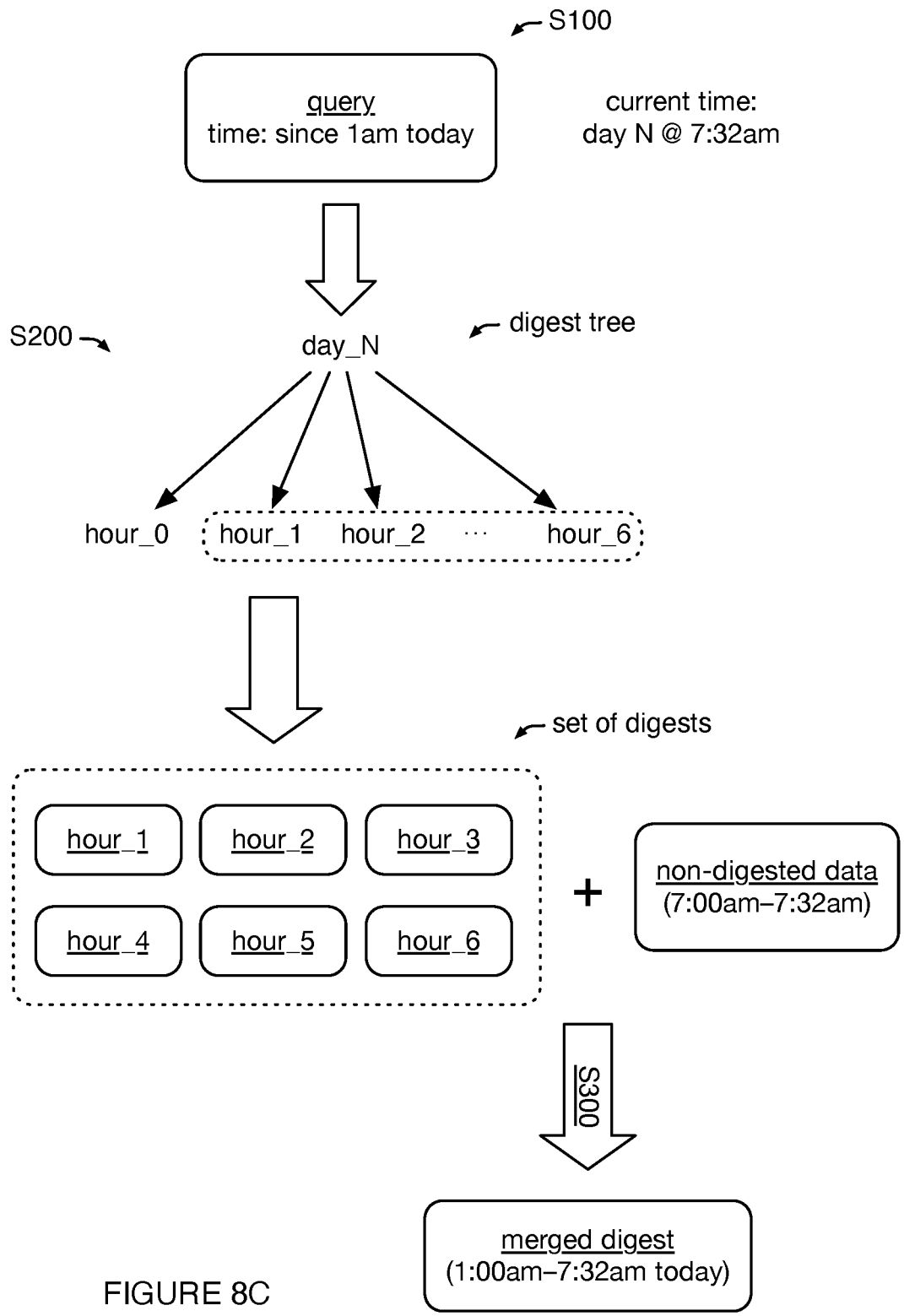

In a first variant, S300 can include merging only the set of digests, such as shown by way of examples in FIGS. 8A-8B.

In a second variant, S300 can include merging the set of digests and non-digested data (e.g., when the data for a subset of the queried range is not available in digested form). For example, S300 can include merging the set of digests and recent dimension data in a non-digest format from the past hour (e.g., stored in hot storage) when current data is needed to answer the query, such as shown by way of example in FIG. 8C.

However, the set of digests can be otherwise merged.

4.4 Determining a Query Result

Figure 3:
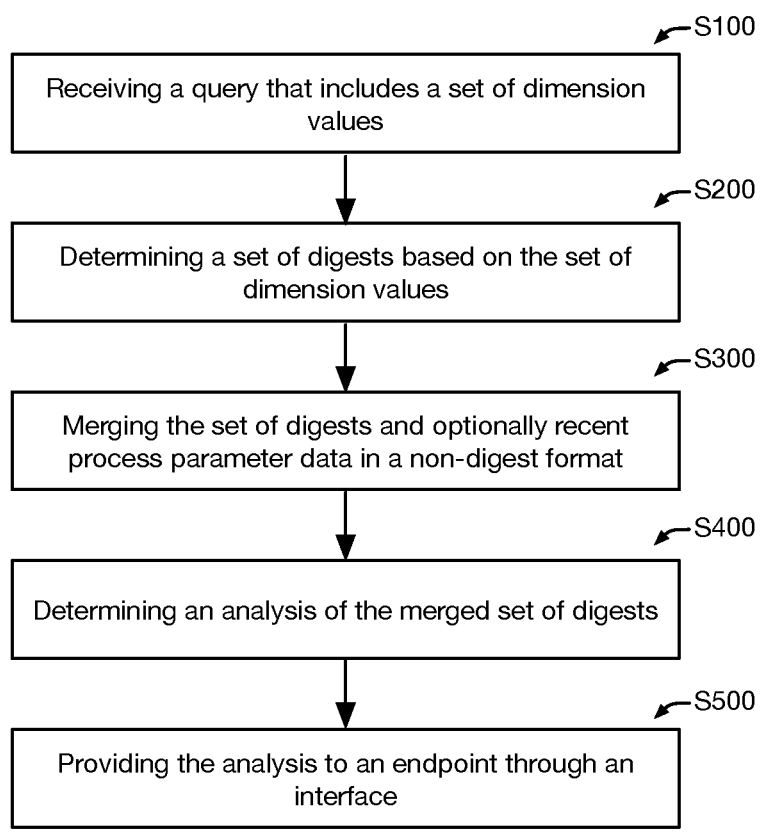
FIG. 3 depicts an illustrative example of a variant of the method.

Determining a query result S400 can function to determine a query result in response to the query. The query result is preferably an analysis of a merged set of digests (example shown in FIG. 3), but can additionally and/or alternatively be an analysis of a single digest (e.g., when a set of digests only includes a single digest), an analysis of a merged set of digests, a single digest, and/or any other suitable information. The analysis (e.g., of a merged set of digests, of a single digest) can include: a histogram, a distribution, a frequency, a minimum, a maximum, an average, a median, a mode, and/or any other suitable information.

In some examples, S400 can include one or more elements such as described in U.S. patent application Ser. No. 18/217,757, filed 3 Jul. 2023 and titled "METHOD FOR MANUFACTURING SYSTEM ANALYSIS AND/OR MAINTENANCE", which is herein incorporated in its entirety by this reference (e.g., can include one or more elements such as described therein regarding 'associating metrics with factory components S120' and/or 'acting based on metric associations S130').

However, the query result can be otherwise determined.

4.5 Providing the Query Result

Providing the query result S500 can function to provide the query result to an endpoint through an interface. The endpoint can be: a customer endpoint, a user endpoint, and/or any other suitable endpoint. The query result can be provided to an endpoint from: a computing system, a machine, and/or any other suitable computing system. The interface can be: a mobile application, a web application, a desktop application, an API, a database, and/or any other suitable interface.

In some examples, S400 can include one or more elements such as described in U.S. patent application Ser. No. 18/217,757, filed 3 Jul. 2023 and titled "METHOD FOR MANUFACTURING SYSTEM ANALYSIS AND/OR MAINTENANCE", which is herein incorporated in its entirety by this reference (e.g., can include one or more elements such as described therein regarding 'acting based on metric associations S130'). In a specific example, S500 can include presenting information to one or more users (e.g., based on the query result) such as described in U.S. patent application Ser. No. 18/217,757 (e.g., generating and/or presenting a list of factory components that may be problematic, presenting information indicative of the expected effects from making a manufacturing system change, etc.; preferably presenting the derivative information to one or more users in a manner that enables the user(s) to explore various aspects of the information, such as via a user interface (UI) that enables viewing data slices associated with the different dimensions of the query).

However, the query result can be otherwise provided.

S500 can additionally or alternatively include taking action (e.g., based on the query result). This can function to improve, enable improvement of, and/or facilitate improvement of manufacturing system function (e.g., by decreasing defect rates, increasing production rates, decreasing variance, etc.). In some embodiments, acting based on the query result can include: providing information based on the query result; altering manufacturing system operation based on the query result; and/or initiating maintenance based on the query result. For example, S500 can additionally or alternatively include taking action (e.g., based on the query result) such as described in U.S. patent application Ser. No. 18/217,757 (e.g., alerting users, altering manufacturing system operation, initiating maintenance, etc.). However, S500 can additionally or alternatively include taking any other suitable actions based on the query result (and/or based on any other suitable information determined and/or received in performance of the method).

S500 can additionally or alternatively include operating manufacturing system machines, which can function to manufacture and/or inspect the products (e.g., SMT boards, injection-molded objects, etc.) designated to be produced by the factory machines. Operating manufacturing system machines can include operating the fabrication/assembly machines (e.g., based on the programming associated with one or more products), operating the inspection machines (e.g., based on the programming associated with the one or more products), and/or providing information for analysis (e.g., provided to one or more analysis tools, such as computing systems).

4.6 Illustrative Examples

Illustrative examples of the system, method, and/or elements thereof are provided below.

In a first illustrative example, the digests include one or more dimensions indicative of component/subassembly production and/or historical information (e.g., lot, supplier, and/or date code, etc. for each of one or more components used in a product and/or subassemblies thereof; work order and/or date code for each of one or more subassemblies used in a product; etc.), along with one or more functional test metrics (e.g., gain, noise, bandwidth, isolation, coupling ratio, characteristic frequencies such as resonance frequencies and/or cutoff frequencies, etc.) associated with the product (and/or with subassemblies thereof). In this example, a query can request a digest (or set of digests) that includes some or all of the component/subassembly production and/or historical information, along with one or more of the functional test metrics (e.g., in response to irregular or undesired performance for a functional test, requesting the associated metric); for example, in response to irregular or undesired performance for a functional test (e.g., high variance or high deviation from a desired or threshold value of that functional test metric) during a first time interval, requesting a digest (or set of digests) that includes the functional test metric and any component/subassembly production and/or historical information that could be relevant to that metric (e.g., information for any components and/or subassemblies that can play a role in the metric), preferably for the entire first time interval (or for a broader time interval that includes the first time interval), but alternatively for a portion of the first time interval and/or for any other suitable interval. The method can then include providing the requested digest or set of digests (or another digest or set of digests similar to the requested digest or set of digests), wherein this digest or set of digests can enable study of potential origin(s) for the observed behavior of the functional test.

In a specific example of this first illustrative example, a product (e.g., satellite) includes a first circuit board type and a second circuit board type. An emergent property of the product (e.g., overall antenna noise floor), which can be characterized after it is assembled (e.g., after installing a circuit board of the first type and a circuit board of the second type), exhibits higher than expected variance (e.g., during a time window, across an entire production run for the product, etc.). In response to this, a query is received, requesting the component/subassembly production and/or historical information (e.g., including a first circuit board type work order dimension and a second circuit board type work order dimension), along with a dimension for the emergent property exhibiting higher than expected variance. The method includes generating a resulting digest (e.g., for a production run of 300 of the product), and the resulting digest is used to perform analysis that reveals that: of the products in the digest, 100 include a first circuit board type from work order A and 200 include a first circuit board type from work order B, while 150 include a second circuit board type from work order C and 150 include a second circuit board type from work order D. The analysis further reveals that the variance of the emergent property for both work order C and work order D is similar to the overall variance, but that the variance is significantly higher for work order A and significantly lower (e.g., comparable to typical variance, within nominal thresholds, etc.) for work order B. From this analysis, it may be concluded that the first circuit board type produced in work order A is likely problematic (e.g., which may be followed by further analysis of other production and/or historical information scoped to work order A, by rejecting the circuit boards from work order A such as excluding them from future production runs and/or returning them to the first circuit board type supplier, etc.). In a variation of this specific example, dimensions indicative of circuit board work orders may not be available, but instead dimensions associated with one or more process parameters from production of those circuit boards may be available; in this variation, analysis of a digest (or set of digests) including those process parameter dimensions may reveal an atypical process parameter condition associated with the higher variance in a subset of the first circuit board type, enabling conclusion that circuit boards corresponding to that atypical process condition are likely problematic.

In a second illustrative example, the digests include one more dimensions (e.g., associated with SMT pick and place operations) indicative of part position (e.g., lateral displacement from a target location, such as total displacement and/or displacement along one or more reference axes, preferably in-plane axes but additionally or alternatively one or more out-of-plane axes such as a plane-normal axis) and/or orientation (e.g., angular displacement from a target orientation, such as total angular displacement and/or angular displacement about one or more reference axes, preferably a plane-normal axis but additionally or alternatively any other suitable axes) of one or more components (e.g., wherein, for at least one such component, one or more of these metrics exhibits irregular or undesired values, such as high error and/or variance), such as position/orientation characterized during AOI. In this example, the digests further include one or more dimensions associated with factory tools and/or parameters to which blame (e.g., as described in U.S. patent application Ser. No. 18/217,757, filed 3 Jul. 2023 and titled "METHOD FOR MANUFACTURING SYSTEM ANALYSIS AND/OR MAINTENANCE", which is herein incorporated in its entirety by this reference) may possibly be attributable for the irregular/undesired component placement, such as unit location, part number, part shape, feeder serial, feeder location, feeder size, nozzle serial, nozzle location, head serial, head location, camera serial, and/or camera position (all for the factory elements that interacted with the component(s) exhibiting irregular/undesired placement). In response to the irregular/undesired value(s), a query can request a digest (or set of digests) that includes some or all of the factory tool/parameter dimensions, along with the metric(s) exhibiting irregular/undesired values (e.g., wherein the query requests a time interval during which the irregular/undesired values are observed). The method can then include providing the requested digest (or another digest similar to the requested digest), wherein this digest can enable study of the root cause(s) for the observed irregular/undesired values.

In a specific example of this second illustrative example, high variance in lateral position of a particular SMT component (e.g., C12) is observed. In response to this, a query is received, requesting one or more dimensions associated with factory tools and/or parameters to which blame for placement of the particular SMT component may possibly be attributable (e.g., unit location, part number, part shape, feeder serial, feeder location, feeder size, nozzle serial, nozzle location, head serial, head location, camera serial, and/or camera position for the factory elements that interacted with C12), along with a dimension for the lateral position of the particular SMT component. The method includes generating a resulting digest, where the resulting digest is used to perform analysis that reveals that, of a number of different nozzles used to place the particular SMT component, a vast majority of the observed lateral position variance is attributable to a single particular nozzle. From this analysis, it may be concluded that the particular nozzle (to which the vast majority of lateral position variance is attributed) is likely defective, and the method can further include performing maintenance to correct the nozzle defect.

In a third illustrative example, the digests include one more dimensions (e.g., associated with solder printing operations) indicative of high variance in solder paste volume (e.g., at a particular location, at a variety of locations, etc.), such as variance in solder paste volume characterized during SPI. In this example, the digests further include one or more dimensions associated with factory tools and/or parameters to which blame (e.g., as described in U.S. patent application Ser. No. 18/217,757, filed 3 Jul. 2023 and titled "METHOD FOR MANUFACTURING SYSTEM ANALYSIS AND/OR MAINTENANCE", which is herein incorporated in its entirety by this reference) may possibly be attributable for the solder paste volume variance, such as unit location and/or solder paste stencil information such as aperture shape and/or stencil identifier. In response to the high variance, a query can request a digest (or set of digests) that includes some or all of the factory tool/parameter dimensions, along with the solder paste volume metric(s) exhibiting high variance (e.g., wherein the query requests a time interval during which the high variance is observed). The method can then include providing the requested digest (or another digest similar to the requested digest), wherein this digest can enable study of the root cause(s) for the observed variance.

In a specific example of this third illustrative example, high variance in solder paste volume at a particular location is observed. In response to this, a query is received, requesting one or more dimensions associated with factory tools and/or parameters to which blame for the variance may possibly be attributable (e.g., unit location, stencil aperture shape, stencil identifier, etc.), along with a dimension for the solder paste volume at the particular location. The method includes generating a resulting digest, where the resulting digest is used to perform analysis that reveals that, of all the unit locations within the board array that defines a panel, a vast majority of the observed solder paste volume variance is attributable to a single position in the array (i.e., a single unit location). From this analysis, it may be concluded that the particular unit location (to which the vast majority of solder paste volume variance is attributed) is likely associated with the problem, and the method can further include performing maintenance to correct the defect.

However, the method can additionally or alternatively include any other suitable elements performed in any suitable manner.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

I claim:

1. A method for manufacturing system operation, comprising:
receiving, from a manufacturing system, a data stream indicative of manufacturing process parameter values throughout a time interval, wherein the data stream is associated with manufacturing of a plurality of printed circuit board assemblies (PCBAs), wherein the manufacturing process parameter values comprise information indicative of a PCBA inspection metric for each of the plurality of PCBAs;
determining a high-variance time interval during which a variance of the PCBA inspection metric is greater than a threshold variance;
based on determining the high-variance time interval, generating a query associated with the manufacturing system such that the query is indicative of the high-variance time interval and of a first set of manufacturing process parameters, wherein each manufacturing process parameter of the set is related to the PCBA inspection metric;
generating, based on the high-variance time interval and the first set of manufacturing process parameters, a set of histogram-preserving digests, wherein each histogram-preserving digest of the set is associated with a respective subinterval of the time interval and a respective set of manufacturing process parameters;
receiving the query; and
in response to receiving the query:
based on the query, selecting a subset of histogram-preserving digests from the set such that the respective subintervals associated with the subset of histogram-preserving digests are disjoint; and
providing a query result based on the subset of histogram-preserving digests.

2. The method of claim 1, wherein:
the data stream is further associated with manufacturing of a plurality of products, each product of the plurality comprising a respective component of a set of components of a first type;
the set of histogram-preserving digests are further indicative of:
historical information associated with the set of components; and
a functional test metric associated with the plurality of products; and
providing the query result comprises presenting information indicative of a relationship between the historical information and the functional test metric.

3. The method of claim 2, wherein:
the query is associated with a set of products of the plurality;
the historical information is indicative of:
a first subset of components of the set, wherein each component of the first subset was produced during a first production run;
a second subset of components of the set, wherein each component of the second subset was not produced during the first production run;
a first subset of products of the set, wherein each product of the first subset comprises a component of the first subset; and
a second subset of products of the set, wherein each product of the second subset comprises a component of the second subset; and
the information indicative of the relationship is indicative that:
the set of products define an overall variance for the functional test metric;
the first subset of products define a first variance for the functional test metric;
the second subset of products define a second variance for the functional test metric, wherein the second variance is substantially lesser than the first variance and is substantially lesser than the overall variance.

4. The method of claim 3, wherein:
each component of the first type is a nominally-identical PCBA of the plurality; and
the functional test metric is an antenna noise metric.

5. The method of claim 3, wherein each component of the second subset was produced during a second production run.

6. The method of claim 3, wherein:
the overall variance exceeds a threshold maximum;
the second variance does not exceed the threshold maximum; and
the method further comprises, in response to the overall variance exceeding the threshold maximum, generating the query, wherein receiving the query is performed in response to generating the query.

7. The method of claim 3, further comprising, based on the query result, rejecting all components produced during the first production run, comprising controlling the manufacturing system not to manufacture products comprising any components produced during the first production run.

8. The method of claim 1, further comprising, before receiving the query, storing the set of histogram-preserving digests in a hierarchical structure, wherein selecting the subset of histogram-preserving digests comprises selecting the histogram-preserving digests of the subset from the hierarchical structure.

9. The method of claim 8, wherein the hierarchical structure defines a hierarchy based on the respective subintervals.

10. The method of claim 9, wherein the hierarchical structure is a tree comprising a plurality of nodes, wherein each node of the tree is associated with a respective histogram-preserving digest of the set.

11. The method of claim 10, wherein a root node of the tree is associated with a histogram-preserving digest associated with a subinterval equivalent to the time interval.

12. The method of claim 10, wherein storing the set of histogram-preserving digests in the tree comprises:
generating a set of leaf nodes, wherein respective subintervals associated with the leaf nodes of the set partition the time interval;
generating a set of parent nodes, wherein respective subintervals associated with the parent nodes of the set partition the time interval, wherein generating the set of parent nodes comprises: for each parent node of the set, merging a respective plurality of leaf nodes to generate the parent node; and
generating a set of grandparent nodes, wherein respective subintervals associated with the grandparent nodes of the set partition the time interval, wherein generating the set of grandparent nodes comprises: for each grandparent node of the set, merging a respective plurality of parent nodes to generate the grandparent node.

13. The method of claim 12, wherein the set of grandparent nodes consists of a root node, wherein the respective subinterval associated with the root node is equivalent to the time interval.

14. The method of claim 1, wherein the subset of histogram-preserving digests comprises a plurality of histogram-preserving digests, wherein providing the query result based on the subset of histogram-preserving digests comprises:
generating a query-specific digest, comprising merging the subset of histogram-preserving digests; and
providing the query result based on the query-specific digest.

15. The method of claim 14, wherein:
the query defines a query time interval, the query time interval comprising a digested subinterval and an undigested subinterval;
the respective subintervals associated with the subset of histogram-preserving digests define a partition of the digested subinterval;
the method further comprises, in response to receiving the query, based on the query, selecting undigested data corresponding to the undigested subinterval; and
generating the query-specific digest further comprises merging the undigested data with the subset of histogram-preserving digests.

16. The method of claim 14, wherein the subset of histogram-preserving digests comprises:
a first histogram-preserving digest associated with a first subinterval defining a first duration; and
a second histogram-preserving digest associated with a second subinterval defining a second duration greater than the first duration, wherein the first and second subintervals are contiguous.

17. The method of claim 1, further comprising, based on the query result, controlling maintenance of the manufacturing system.

18. The method of claim 17, wherein controlling maintenance of the manufacturing system comprises:
based on the query result, identifying a set of components of the manufacturing system that have an elevated probability of defective operation; and
in response to identifying the set of components, selecting the set of components for inspection.

19. The method of claim 17, wherein controlling maintenance of the manufacturing system comprises:
based on the query result, identifying a component of the manufacturing system that has an elevated probability of defective operation; and
in response to identifying the component, selecting the component for repair.

20. The method of claim 1, wherein: •each PCBA comprises a respective surface mount technology (SMT) component;
for each PCBA, the PCBA inspection metric is indicative of lateral displacement of the respective SMT component relative to a target location of the PCBA;
the manufacturing system comprises a plurality of feeders, a plurality of nozzles, a plurality of heads, and a plurality of cameras;
the set of manufacturing process parameters comprises at least one of: PCBA location, feeder location, feeder identifier, feeder size, nozzle location, nozzle identifier, head location, head identifier, camera position, or camera identifier.

21. The method of claim 1, wherein:
the PCBA inspection metric is indicative of solder paste volume;
the manufacturing system comprises a solder paste stencil; and
the set of manufacturing process parameters comprises at least one of: PCBA location or solder paste stencil information.

22. The method of claim 1, wherein the query result comprises a measure of dispersion, wherein providing the query result comprises, based on the subset of histogram-preserving digests, computing the measure of dispersion.

* * * * *

UNITED STATES PATENT AND TRADEMARK OFFICE
CERTIFICATE OF CORRECTION

PATENT NO. : 11,886,177 B1
APPLICATION NO. : 18/239044
DATED : January 30, 2024
INVENTOR(S) : Timothy Burke It is certified that error appears in the above-identified patent and that said Letters Patent is hereby corrected as shown below:

In the Claims

Column 20, Claim 20, Line 36, delete "wherein: •each" and insert --wherein: each-- therefor Signed and Sealed this
Nineteenth Day of March, 2024

Katherine Kelly Vidal
*Director of the United States Patent and Trademark Office*